(12) United States Patent
Regnier

(10) Patent No.: US 6,886,140 B2
(45) Date of Patent: Apr. 26, 2005

US006886140B2

(54) FAST ALGORITHM TO EXTRACT FLAT INFORMATION FROM HIERARCHICAL NETLISTS

(75) Inventor: John W. Regnier, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 422 days.

(21) Appl. No.: 10/050,067

(22) Filed: Jan. 17, 2002

(65) Prior Publication Data

US 2003/0139842 A1 Jul. 24, 2003

(51) Int. Cl.[7] .............................................. G06F 17/50
(52) U.S. Cl. .................................. 716/1; 716/2; 716/3
(58) Field of Search ........................................ 716/1–21

(56) References Cited

U.S. PATENT DOCUMENTS

| | | | |
|---|---|---|---|
| 5,528,508 A | | 6/1996 | Russell et al. |
| 5,761,664 A | * | 6/1998 | Sayah et al. ................. 707/100 |
| 5,790,416 A | * | 8/1998 | Norton et al. ................. 716/11 |
| 5,805,860 A | | 9/1998 | Parham |
| 5,875,115 A | | 2/1999 | Weber |
| 6,026,219 A | | 2/2000 | Miller et al. |
| 6,113,647 A | | 9/2000 | Silve et al. |
| 6,263,483 B1 | | 7/2001 | Dupenloup |
| 6,577,992 B1 | * | 6/2003 | Tcherniaev et al. ........... 703/14 |
| 6,578,183 B1 | * | 6/2003 | Cheong et al. ................. 716/7 |
| 6,591,402 B1 | * | 7/2003 | Chandra et al. ................ 716/5 |
| 6,668,362 B1 | * | 12/2003 | McIlwain et al. .............. 716/5 |
| 6,684,376 B1 | * | 1/2004 | Kerzman et al. .............. 716/8 |
| 6,735,750 B1 | * | 5/2004 | Korzyniowski et al. ....... 716/5 |
| 2002/0087940 A1 | * | 7/2002 | Greidinger et al. ............ 716/2 |
| 2002/0112221 A1 | * | 8/2002 | Ferreri et al. ................. 716/17 |
| 2003/0005400 A1 | * | 1/2003 | Karniewicz .................... 716/8 |
| 2003/0018948 A1 | * | 1/2003 | Chang et al. ................... 716/8 |
| 2003/0079190 A1 | * | 4/2003 | Parashkevov et al. ......... 716/4 |
| 2003/0084416 A1 | * | 5/2003 | Dai et al. ....................... 716/7 |
| 2004/0025129 A1 | * | 2/2004 | Batchelor ....................... 716/6 |
| 2004/0078767 A1 | * | 4/2004 | Burks et al. ................... 716/8 |

* cited by examiner

Primary Examiner—Stacy A. Whitmore
Assistant Examiner—Magid Y. Dimyan
(74) Attorney, Agent, or Firm—Dickstein Shapiro Morin & Oshinsky LLP (57) ABSTRACT

The present invention provides a method and apparatus which extracts flat data from a hierarchically related representation of a circuit, such as a netlist. The apparatus and method identifies unique cell elements by a cell instance identifier and determines flat data associated with those elements. When a previously encountered cell instance which has flat data stored describing that element is selected, higher level flat data which has been stored as the apparatus traverses the representation is appended to the stored flat data for the selected element. In this manner, an optimum flat data path to all elements, nets and components is created without a need for re-scanning previously encountered cell instances.

37 Claims, 9 Drawing Sheets

| FIG. 6(A) |
|---|
| FIG. 6(B) |

FIG. 6(A)

PROGRAM OUTPUT

```
-------------------%HV...
inst=<ercFlatA>
    <INA_1> ----->( <X0> )                    ⎫
inst=<ercFlatB>                                │
    <net2> ----->( <X0> )                     ⎬ 301
inst=<ercFlatTOP>                              │
    <TOP_2> ----->( <X0> )                    ⎭

-------------------%FLATHV...
         ⎡ /I0/net2----->( /I0/I1/X0 )      ⎤
  top    │ /TOP_1----->( /I2/X0 )           │
  path   │ /I0/I2/net2----->( /I0/I2/X0 )   ⎬ 303
  keys   │ /I3/net2----->( /I3/X0 )         │
         ⎣ /TOP_2----->( /X0 /I0/I0/X0 )    ⎦

-------------------%FLATHVCACHE...
Cell=<ercFlatA>
```

FIG. 6(B)

```
        Flat
          INA_1----->( X0 )
        Check
        Deep
Cell=<ercFlatB>
        Flat
        Check
        Deep
          net2----->( X0 )
Cell=<ercFlatTOP>
        Flat
        Check
          TOP_1----->( I2/X0 )
          TOP_2----->( I0/I0/X0 )
        Deep
          I0/net2----->( I0/I1/X0 )
          I0/I2/net2----->( I0/I2/X0 )
          I3/net2----->( I3/X0 )
Cell=<ercFlatC>
        Flat
        Check
          net2----->( I1/X0 )
          INC_1----->( I0/X0 )
        Deep
          I2/net2----->( I2/X0 )
```

FAST ALGORITHM TO EXTRACT FLAT INFORMATION FROM HIERARCHICAL NETLISTS

FIELD OF THE INVENTION

This invention relates generally to the field of design and testing of semiconductor integrated circuits and more particularly to error detection and testing of semiconductor chip schematic designs used in semiconductor manufacturing.

BACKGROUND OF THE INVENTION

Computer aided design (CAD) systems are used to design complex integrated circuits or dies. Schematic designs are created using such CAD systems which describe the integrated circuit components and interconnections between components which will be fabricated within integrated circuit dies.

CAD systems typically store the circuit designs in memory within a hierarchical form or a flat form. The hierarchical structure of a circuit design description is represented by parent-child relationships. The hierarchical representational system breaks the system being designed into a top level module or modules which include smaller blocks within them that make up the top level module. The overall system is the top most module. The top level module does not usually include any reference to gates or other circuits, but rather refers more to the function accomplished by the top or macro level component(s) which are the largest functional component(s) in the design.

Each next lower level of module includes a smaller number of modules until the level or subset of the total system is reached which contains only primitives or the most basic circuit sub-components, such as a NMOS transistor or a resistor. A hierarchical representation of a circuit design allows designers to solve complex circuit design problems using the divide and conquer approach. Complexity is reduced to the point where the overall design can be understood without being obscured by the details of a very large circuit design. High levels of abstraction permits a designer to understand the system under development at many levels.

Hierarchical designs can be organized in a number of ways such as "top down" and "bottom up". The top down methodology starts by defining the top level blocks and identifying the sub-blocks necessary to built the top level blocks and further subdivides these sub-blocks into leaf cells, which are the lowest level of a circuit design. For example, a leaf cell may be a cell within a hierarchical representation that does not contain any other cells, thus it is the lowest level in the hierarchical representation. The subdivision of lower components into lower cells or modules usually stops when there is no further significant advantage in reusability and comprehensibility of detail.

The bottom-up design methodology approach begins from the leaf cells, which are the terminal end of a branch of cells in a tree type circuit hierarchy and thus represent the "bottom" of the tree schematic. Designers begin to construct the higher cell blocks in the circuit design hierarchy using available leaf cells. A designer continues building the next higher blocks until the final design is realized.

In practice neither bottom-up or top-down approach is used alone. A combination of both approaches is typically used. Usually when decomposing a hierarchy, the design is partitioned into several sub-modules based on their functionality. This is sometimes known as vertical partitioning.

The second type of CAD system design relationship uses a flat representation of circuit components in a design. Each component connects directly to another component, rather than being defined in a modular approach seen in the hierarchical system, where modules connect to other modules.

Once a schematic circuit design has been created using CAD systems, it is output as a netlist. Netlists are computer files which contain a textual or character based description of the integrated circuits and the relationships between the circuits or cells that comprise a device described by the netlist or schematic design.

Netlists can be organized in the hierarchical or the flat form. A flat data netlist contains multiple copies of the circuit modules without boundary descriptions found in hierarchical representations, usually consisting of module or cell instance names. For example, a flat data netlist will list one or more flat paths describing a string of components that are connected at a highest level in the circuit design hierarchy through a lowest component. In other words, a flat path it is a path statement from a starting place, usually the highest point in that particular path, to a specified endpoint marker or either the lowest or bottom-most primitive component in a particular current or circuit path. The start or stop points can also be selected based upon a desire to test a segment within a larger circuit path.

CAD tools are commonly linked together and must be able to convert from one format to another format depending on the stage of the integrated circuit design process. Hierarchical netlists are typically used when designing the integrated circuit as that format helps designers easily understand how the different components in the system being designed work together. Flat data netlists are usually required when other CAD tools are used such as timing verification, circuit simulation and circuit placement and routing tools.

One type of electronic design automation (EDA) system used to evaluate and perform error checking on the netlist after the design is compiled includes electrical rule check (ERC) programs. ERC programs look at a netlist schematic and make sure markers or other specific components are present within the schematic design and then evaluates how the system design works with respect to the markers placed in the netlist. The ERC system focuses on looking for a particular electrical marker/component such as high voltage (HV) net markers, super voltage (SV) net markers, pad markers, super voltage fuse markers, negative voltage net markers for lower voltage charge pumps (lower than zero volts) and any other type of marker.

ERC systems require a flat data netlist representation to perform rule checking in some cases. (Some checks are done solely on a hierarchical representation, such as verification that a particular marker is at all levels of the hierarchy) ERC systems which must scan through each instance of a cell or combination of cells in a large integrated circuit design would require very large amounts of processing time to perform ERC functional checks on hierarchical lists. Consequently, a hierarchical netlist representation must be converted to a flat data netlist to decrease ERC processing time. An ERC system starts with a beginning reference point and then performs rule checks for circuit components that are listed from the reference point along the absolute path statement. A reference point may be a cell description, net descriptor (an electrical connection, e.g. "wire" between components or cells), HV marker or any specified circuit component or group of circuit components and/or markers and/or net descriptors. The ERC system evaluates how a marker or circuit component interacts with the rest of the design by looking for failure modes that occur when certain combinations are present, such as improper associations of a component with a marker e.g. pad marker associated with a circuit component which is incompatible with the pad. Markers (also called flat data search targets with respect to flat data search programs) are used by ERC programs to identify circuit components within a hierarchical netlist which are being evaluated for improper combinations with other circuit components during ERC checks.

The flat data netlist used in ERC systems includes an absolute path down to the marker via instance names. Flat net information includes a path statement for every marker along with net names without listing cell instance identifiers in the path description usually from a top level to a lower level cell or component in a circuit schematic which lie on a net. Cell instances are required to describe a hierarchy of larger to smaller cells.

Conventional flat data programs perform searches in a hierarchical netlist to assemble flat path statements. Such a program typically starts at a top level cell then looks at every instance in that cell progressing or traversing down through each subsequent level in the hierarchical circuit schematic or netlist until the flat data search system has assembled a flat description for the netlist which includes all the markers throughout the entire system. Such flat data programs assembles path statements as the program progresses from a top descriptor to a bottom descriptor. This can take a great deal of time when dealing with very large systems such as a DRAM. For example, a DRAM can have hundreds of millions of cells which the flat list search system must go through and create an absolute path statement to populate the flat data file. It is not uncommon for a conventional flatlist system to take three for four days to go through a DRAM circuit to assemble the flat data with flat path statement for each net running from one specified point to another specified point. Thus, a need exists to improve the ability for flat data programs to assemble flat data required for rapid development of integrated circuits.

SUMMARY OF THE INVENTION

The present invention provides a method and apparatus which assembles absolute path statements in flat data by scanning cells and circuit components of a hierarchical netlist, recording the path statement from boundary of the scanned hierarchical cell to a cell or marker within the cell, then appending the recorded path to the path of a subsequently scanned hierarchical cell or component which contains the previously record cell thus avoiding the necessity of rescanning previously encountered cells.

BRIEF DESCRIPTION OF THE DRAWINGS

These and other features and advantages of the invention will be better understood from the following detailed description which is provided in connection with the accompanying drawings.

DESCRIPTION OF THE INVENTION

In an exemplary embodiment the invention rapidly extracts flat data from the bottom up, storing flat path statements for the components it has scanned, then combining or prepending the stored flat path statement segment to the flat path data sequence being assembled when identical element instances are subsequently encountered. In other words, the first time a cell is encountered, it is scanned and flat data is stored within a data structure for holding cell information. When the flat data engine progresses to another cell in the cell hierarchy, it checks to see if it has previously encountered the newly scanned cell and recorded the cell's path data. If the cell has been scanned and flat data recorded, then the recorded flat data path segment is added to the path that is being assembled at that point in the traversal thereby avoiding the need to repetitively scan and record each element each time another cell is encountered. Thus, no cell or module will need to be searched more than once during the traversal. This is a major speed enhancement for flat data extraction within a hierarchical netlist with multiple instances of identical modules.

Figure 1:
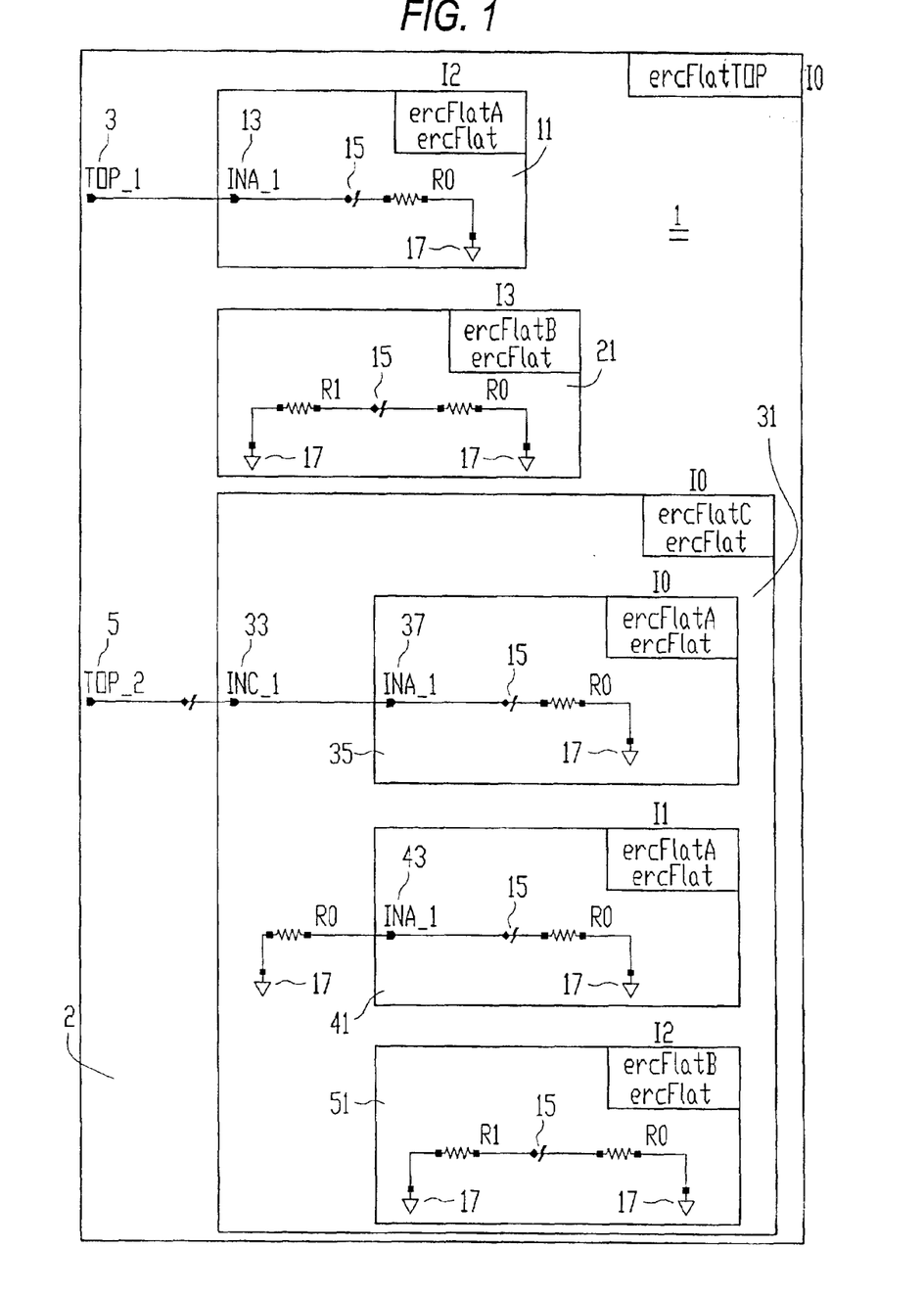
FIG. 1 shows a schematic describing a plurality of hierarchical elements describing a circuit.

FIG. 1 shows an exemplary set of hierarchical schematics having several top level modules which are scanned by the invention. It should be noted that FIG. 1 is only an exemplary hierarchical schematic and that the invention has universal application to any electrical circuit represented in a hierarchical form. As mentioned above, the highest level in a hierarchical design is the top level which usually describes the largest module(s) or component(s) which make up the hierarchical design. Cells which contain other cells, for example ercFlatC (I0) 31, are also known as parent cells as a parent cell contains one or more child cells.

Sub-modules or components contained within the topmost or higher levels module or component schematics are referred to as child cells. The child cells of FIG. 1 include ercFlat A (I0) 35, ercFlat A (I1) 41 and ercFlatB (I2) 51 since they are within ercFlatC (I0) 31. Child cells can have either specific circuit components within them or other child cells within them or both.

A child cell which has no further child cells within it is also known as a leaf cell and is the lowest form of hierarchical circuit description. Referring to FIG. 1, instance 2 (I2) of ercFlat A 11, instance 3 (I3) of ercFlatB 21, instance 0 (I0) of ercFlat A 35, instance 1 (I1) of ercFlat A 41 and instance 2 (I2) of ercFlatB 51 are all leaf cells since no further cells are contained within those cells. The term "instance" is used to distinguish between cells with the same name that are used within a circuit representation, for example instance zero of ercFlatA, instance one of ercFlatA and instance two of ercFlatA. On the other hand, instance 0 (I0) of ercFlatC 31 contains ercFlat A (I0) 35, ercFlat A (I1) 41 and ercFlatB (I2) 51 thus it is not a leaf cell. Note that ercFlatC is a child cell as ercFlatC 31 is contained within a larger hierarchical cell, ercFlatTOP 2. Leaf cells can contain a description of the components within the cell or the leaf cell can merely contain a description of the function the cell performs.

The term instances, such as instance zero (I0) of ercFlatC 31 in FIG. 1, is a descriptor that symbolizes an occurrence of a cell in a specific circuit design rather than a generic description of the cell in isolation and without reference to the cell's location within a circuit design's hierarchy. The same generic cell can have several instances or occurrences of itself. For example, the generic ercFlat A in FIG. 1 has three instances, ercFlat A I0 35, ercFlatA I1 41 and ercFlatA I2 11. Each occurrence of a cell within a hierarchical design is given an instance number, e.g. within ercFlatTOP 2, there are three cell instances I0 (ercFlatC 31), I1 (ercFlatB 11) and I2 (ercFlatA 11). Within ercFlatC 31 there are multiple cell instances including I0 (ercFlatA 35), I1 (ercFlatA 41) and I2 (ercFlatB 51).

The schematic of FIG. 1 also describes nets which are used within a hierarchical circuit design. A net is a descriptor that references an interconnection of some type between cells or components found within a hierarchy. Nets are found at the top-most hierarchy of a circuit design running to parent and child cells. For example, referring to FIG. 1, the TOP_1 net 3 runs to ercFlatA I0 11 where it terminates. Within ercFlatA I2 I1, another net, net INA_1 13, runs from an incoming cell hierarchy boundary point (CHBP) to a component within the cell ercFlatA I2 11 and terminates at an interconnection point with yet another net, net 2 17, at another CHBP. A signal or voltage goes through components in a cell, but CAD tools see different net names for carrying a voltage from one component to another component in most cases. A net terminates at a component then another net begins on the other side of the component. Thus, cells or nets define beginning and ending interconnections or interfaces between cells and from other nets running to points within cells.

An absolute path statement refers to a hierarchical description which indicates a string of elements in terms of cell or circuit component instance names within a hierarchical circuit design which lie between two points. For example I0/I0/R0 describes an absolute path to the R0 resistor within ercFlatA I0 (35) in the FIG. 1 schematic. The term "absolute" is a more specific definition of hierarchical path. An absolute path statement takes you exactly to one place. Thus, multiple hierarchical net paths can exist that describe the same absolute net path. For example, an absolute path to the INA_1 net in FIG. 1 would be I0/I0/INA_1, which refers to the unique net identifier INA_1 inside instance zero of ercFlatC and instance zero of ercFlatA.

In contrast to an absolute path, there are several hierarchical paths that could be used to describe net INA_1 in instance zero of ercFlatA that is within instance zero of ercFlatC. Other hierarchical paths to INA_1 include the /TOP_2 net in FIG. 1 that is a hierarchical path that describes the same net path as an absolute path to INA_1 within ercFlatA within ercFlatC. Another hierarchical path, I0/INC_1, also describes another hierarchical path to INA_1 within ercFlatA which is within ercFlatC. Thus, when desiring to define a component by a path statement, a unique absolute path statement is used rather than a hierarchical path statement.

A hierarchical path statement describes cells within cells using cell names and circuit component descriptions, for example, ERC flat C/ERC flat A/R0. This is the hierarchical path to the R0 resistor. This path statement does not indicate each and every instance name (e.g. I0, I1, I2). Instead, the path statement only indicates that if you have a Cell C, there will be a Cell A in it and a resistor R0 in it. A hierarchical path statement uses generic description rather than a reference to the exact cell with the exact instance names for the multiple instances within the larger cell e.g. first instance of cell C, second instance of cell C and third instance of cell C.

Figure 2:
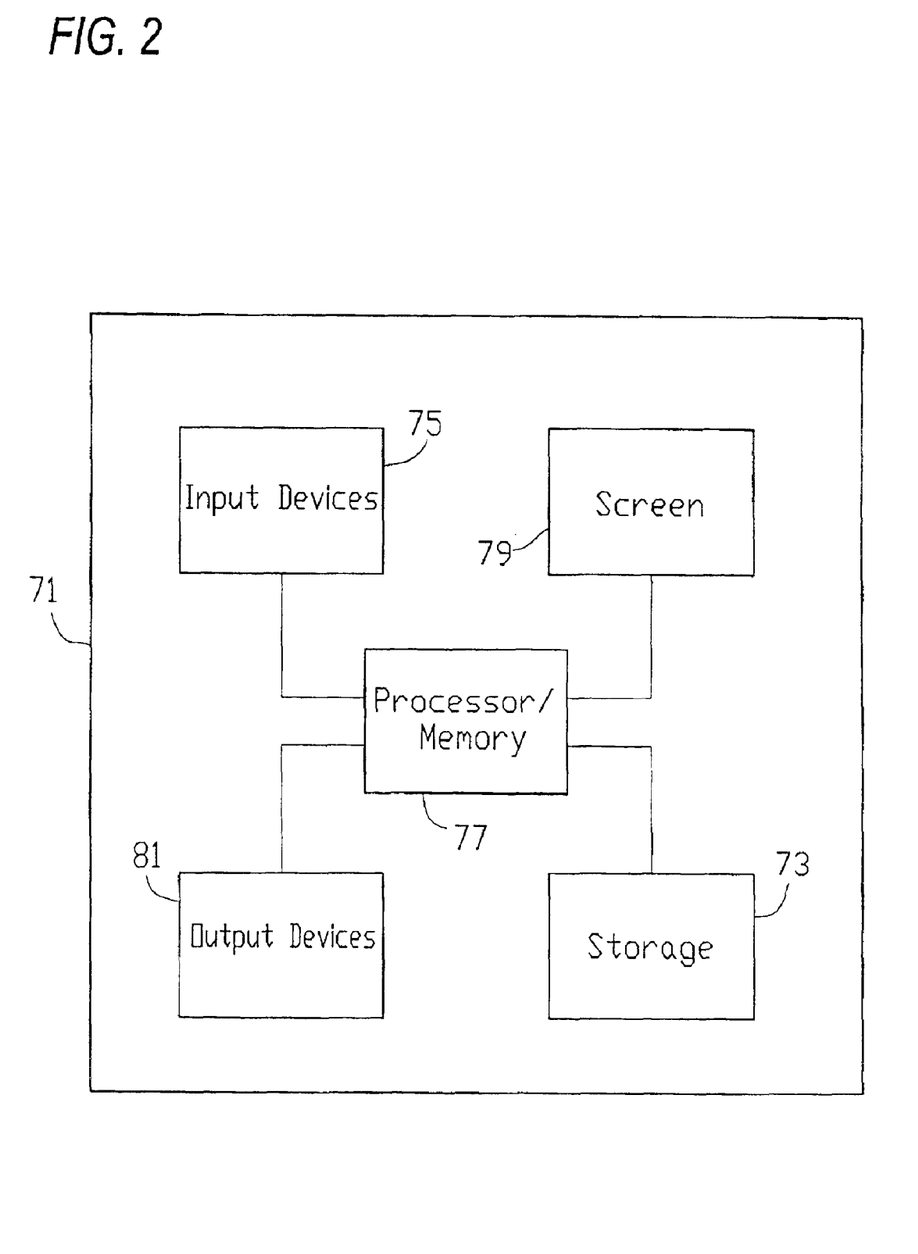
FIG. 2 shows a computer system employing an embodiment of the invention.

Referring to FIG. 2, a computer system 71 employing an embodiment of the invention is disclosed. A storage device/medium 73 stores and retrieves the flat data extraction program as well as the variables and other required data elements. Command inputs are made through input devices 75 to activate the flat data extraction program and input commands. The screen system 79 can display status, commands and results associated with the flat data extraction program. The processor/memory 77 executes commands and manipulates data associated with the flat data extraction program. The printer 81 outputs flat data as specified in the flat data extraction program or as directed by commands input through input devices 75. Output flat information or data can also be stored into a data storage medium or transferred to other computer systems.

Figure 3:
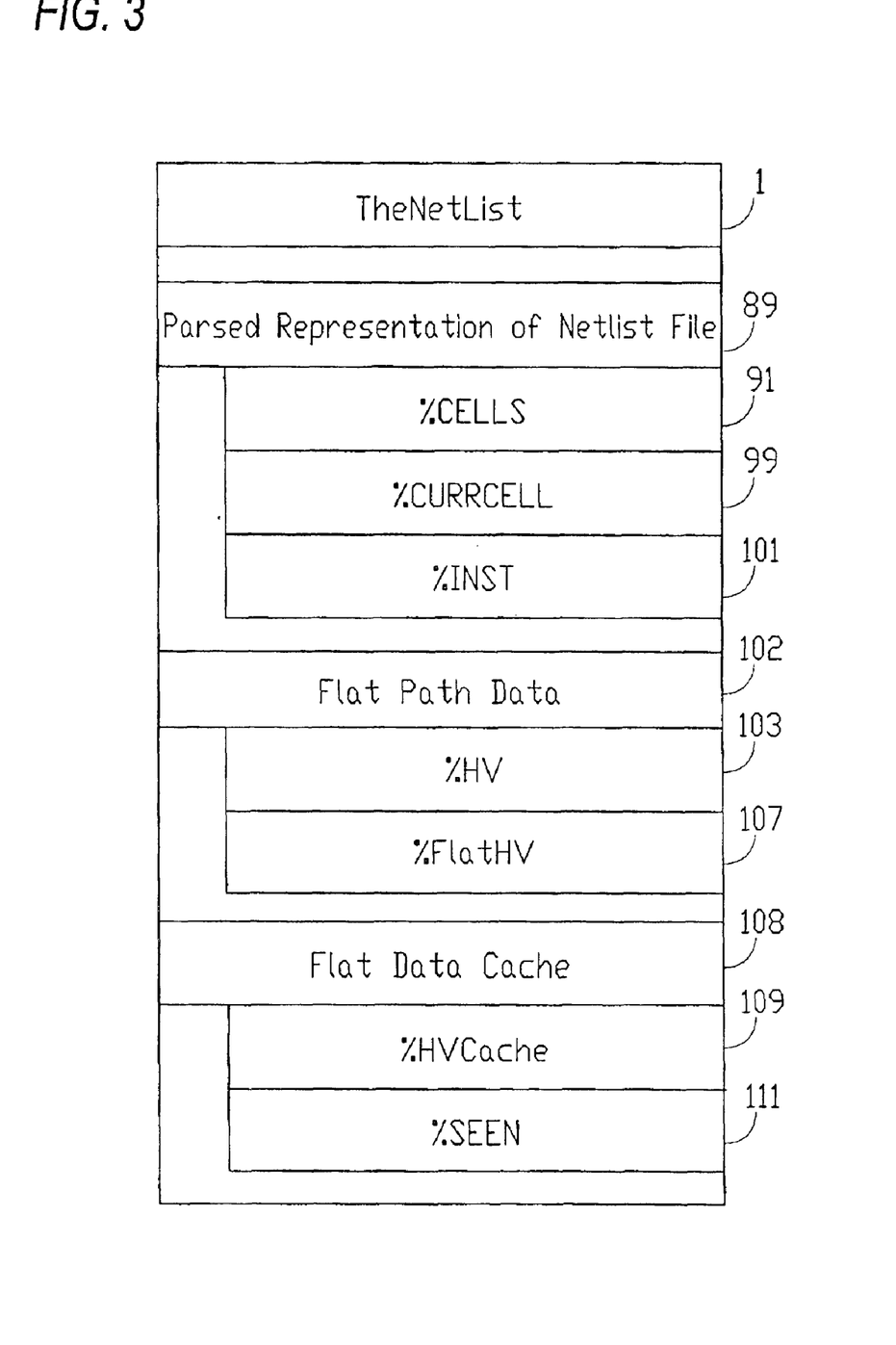
FIG. 3 shows exemplary system architecture for one embodiment of the invention.

Referring to FIG. 3, exemplary data structures employed by one embodiment of the invention are disclosed. A hierarchical netlist 1 contains the data which will be parsed. Parsed data 89 includes cells data (% CELL) 91, current cell being scanned (% currcell) and instance data (% INST) 101. Marker data 102 is stored for local nets and flat net paths including the % HV data structure 103 which includes local HV marker data and % FlatHV data structure 107 which stores the flat data which is being assembled. The flat data cache data structures 108 stores flat path data, cell segment information and traversal information. The % HVCache data structure 109 includes cell instance data which is used to append to upper level flat data sequences when a previously scanned cell instance is encountered during netlist traversal. The % SEEN data structure 111 stores instance recognition information which is used to identify which cell instances have been encountered during netlist traversal.

Figure 4:
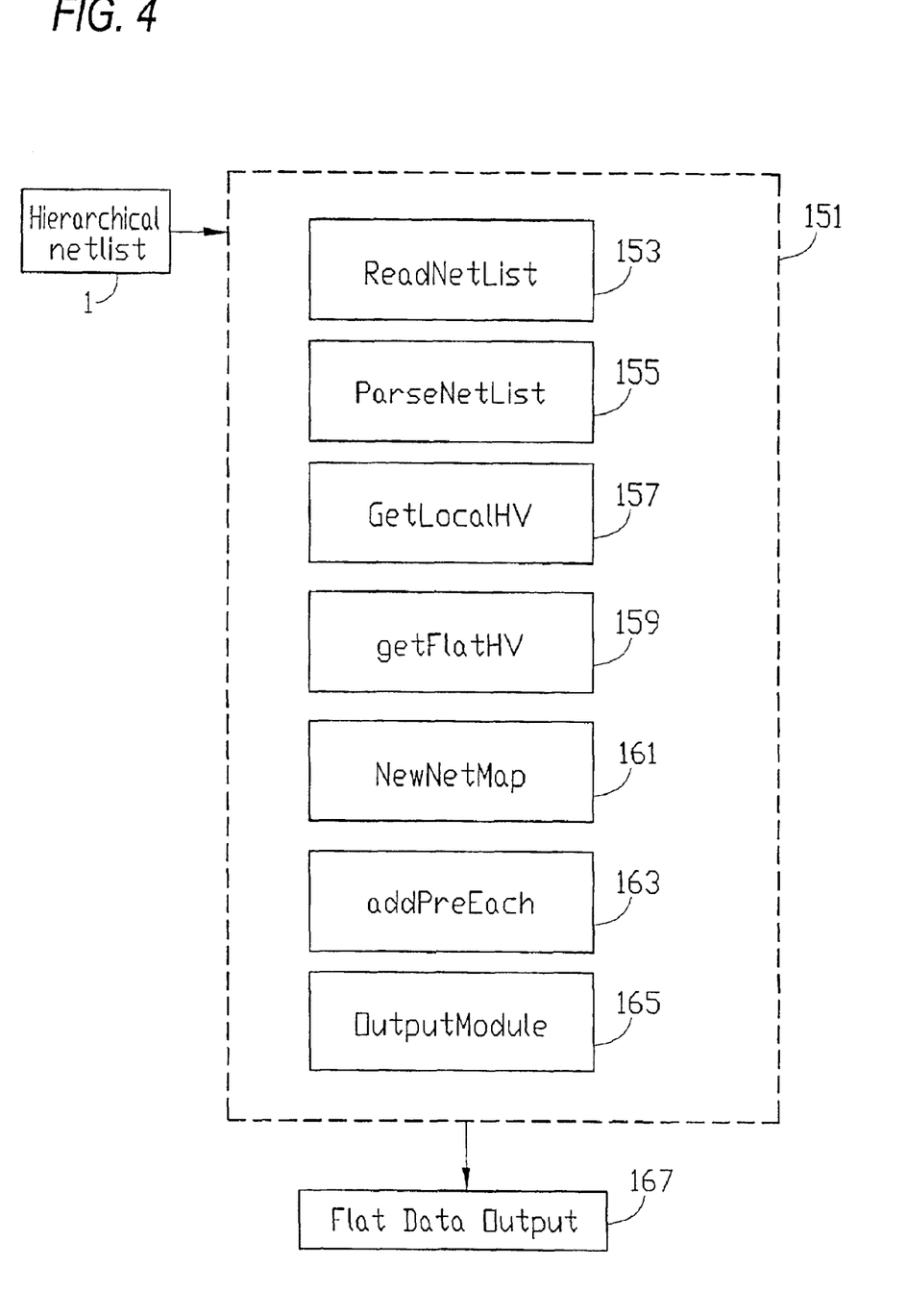
FIG. 4 shows exemplary data structures employed by one embodiment of the invention.

Referring to FIG. 4, major components of a system in one embodiment of the invention are disclosed. A hierarchical netlist 1 is input into the flat data extraction engine 151 for processing. The ReadNetlist module 153 reads in a hierarchical netlist file 1. The ParseNetlist module 155 parses the hierarchical netlist 1, identifies cell and instance information then copies cell and instance information into variables % CELLS 91 and % INST 93 and then returns the name of the last cell which should be in the top level cell 99 within the netlist 1 hierarchy, which in this case is ercFlatTOP 2. The getLocalHV module 157 creates a list of local HV nets and markers within each instance type and stores this data in the % HV data structure 103. The getFlatHV module 159 finds all flat HV nets and markers in the input netlist 1. The newNetMap module 161 updates net mapping from parent to child cells. The addPreEach module 163 adds strings to the beginning of each element in the flat data 167 which is being created. Several output modules exist 165 for printing or outputting data such as flat data 167. The term module is used here to describe a computer processing sequence, function, subfunction, member function, method, subroutine or section of a subroutine.

Figures 5, 5A:
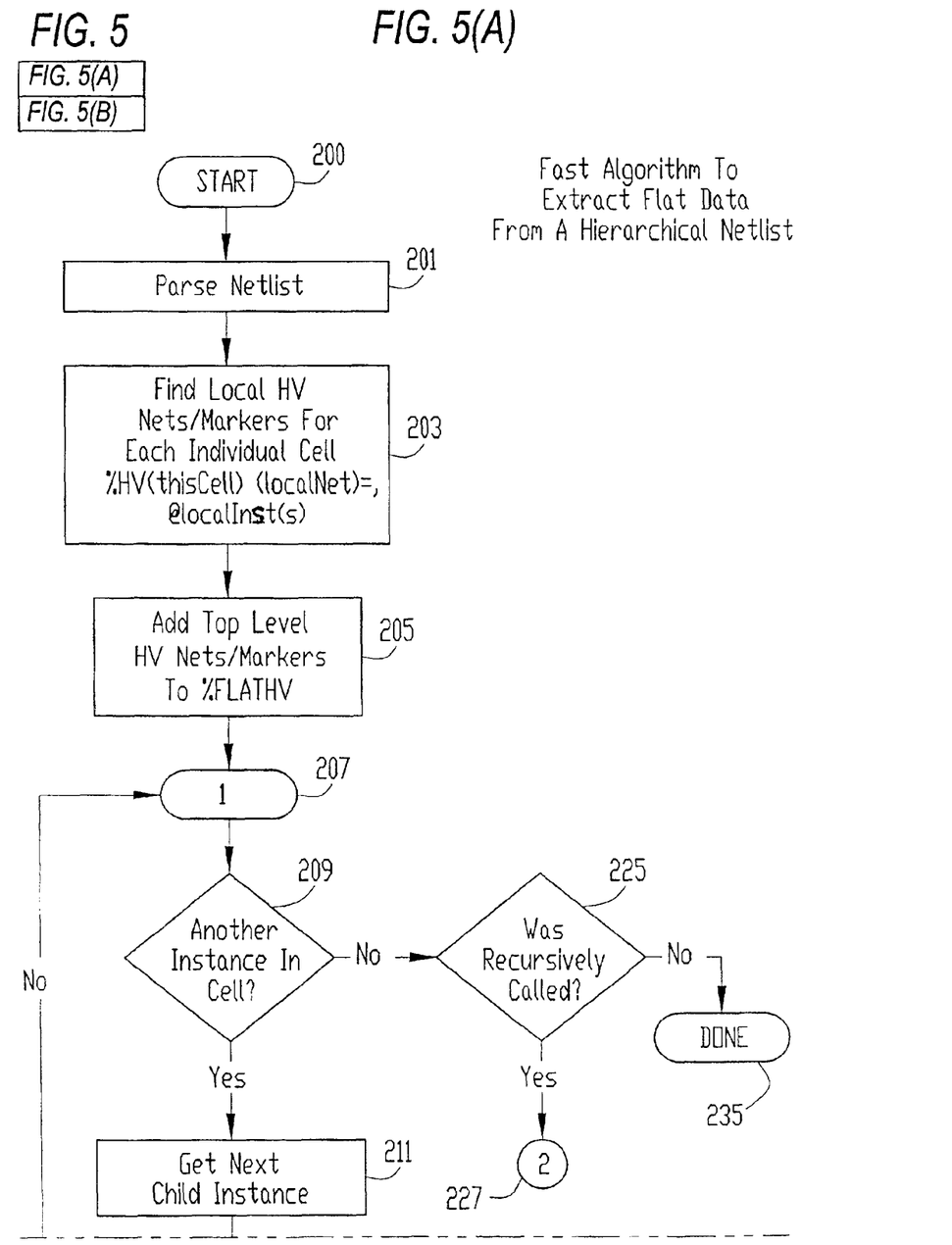
FIG. 5a shows a portion of a processing sequence for processing and testing a netlist and assembling an absolute path statement constructed in accordance with an exemplary embodiment the invention.
Figure 5B:
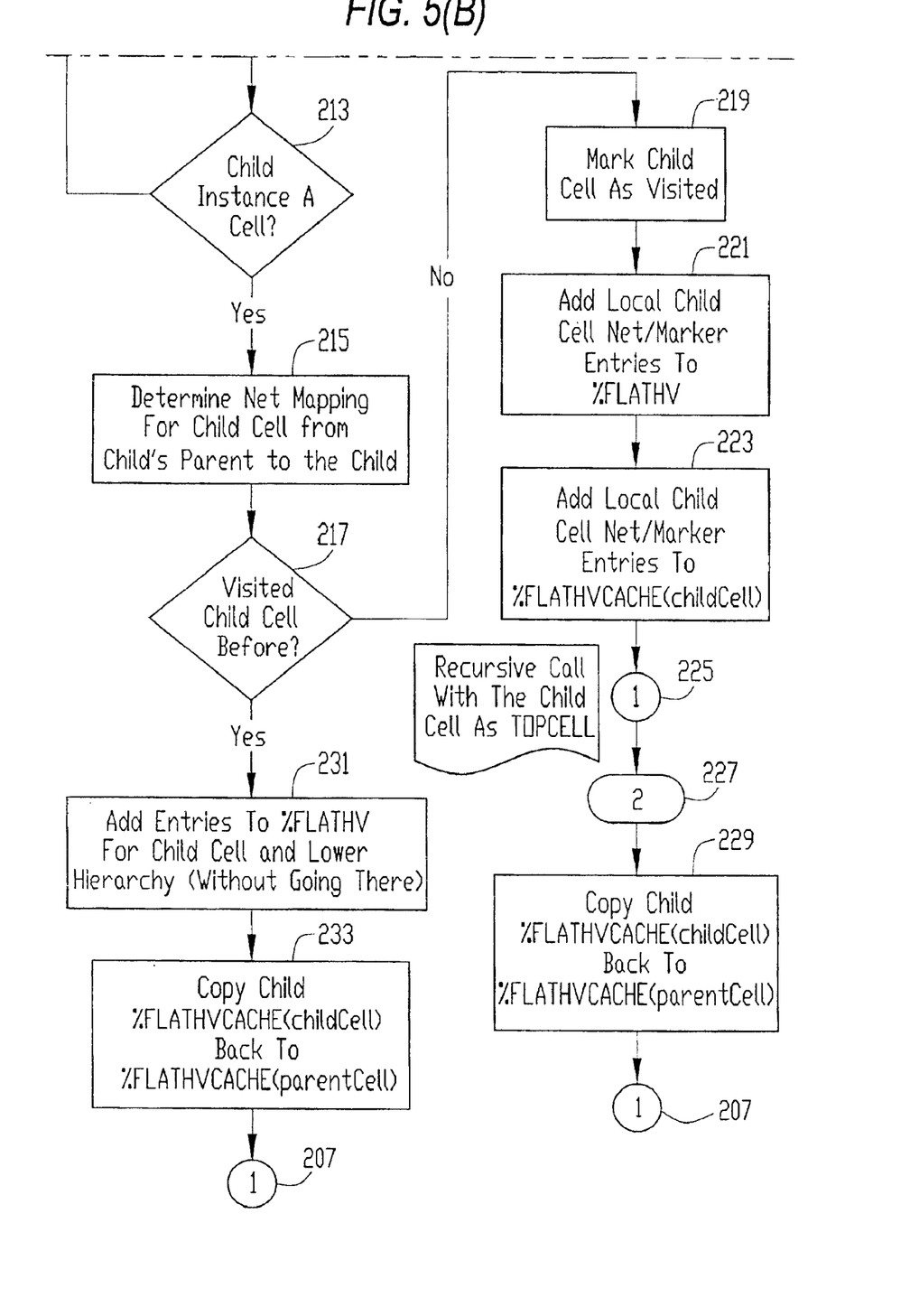
FIG. 5b shows a portion of a processing sequence for processing and testing a netlist and assembling an absolute path statement constructed in accordance with an exemplary embodiment the invention.

Referring to FIGS. 5a and 5b, one exemplary processing sequence that may be used to carry out the invention is disclosed. Processing is initiated by loading a hierarchical netlist 1 into the processing system 71 through either the input device 75 or from storage 73 and the ReadNetlist module 153 reads in hierarchical netlist 1 at processing segment 200. Next, the input hierarchical netlist 1 is parsed by the parseNetlist module 155 storing cell data into variable % CELL 91, instance data into % INST 93 at processing segment 201. In processing segment 203, the getLocalHV module 157 parses the instances (% INST 101) finds local HV nets/markers 103 for each individual cell type (i.e. searches one instance of FIG. 1 ercFlatA 11, ercFlatB 21, ercFlatC 31) and stores local marker and cell data into data structure % HV 103. It should be noted that processing segment 203 could also be performed later in the processing sequence such as, for example, in FIG. 5b after processing segment 219 since segment 221 and 223 use the cell and HV marker. In processing segment 205, the getFlatHV module 159 is called and the top level HV nets/markers 15 are added to the % FLATHV 107 data structure. Next, the getFlatHV module 159 checks to see if there is another instance in the cell which is currently being scanned at processing segment 209. The getFlatHV module 159 will then get the identity or name of the next unscanned child instance in the current cell being scanned at processing segment 211. Note that the next child instance may be a cell instance, a marker or other component such as a resistor. Referring to FIG. 5b, the GetFlatHV module 159 will then determine if the next child instance is a cell at processing segment 213. Referring to FIG. 5a, if the next child instance is not a cell, then processing is branched back to processing segment 207 and then getFlatHV 159 will again check to see if there is another instance in the current cell being scanned at processing segment 209. If there is another instance, then GetFlatHV 159 will again check to see if the scanned instance is a cell at processing segment 213 (FIG. 5b). This loop from processing segment 213 back to 207 will continue until either there are no other instances (processing segment 209) or the instance being scanned is a cell (processing segment, FIG. 5b, 213).

Referring to FIG. 5b, if the getFlatHV module 159 determines there is another cell instance within the current cell hierarchy at processing segment 213 (e.g. in the FIG. 1 schematic, there are multiple child cells within ercFlatC 31), then the getFlatHV module 159 will then determine the net mapping for the child cell from the child's parent to the child by calling the netNetMap module 161 at processing segment 215 which will store net mapping information. The getFlatHV module 159 will then determine if the child cell has been scanned previously at processing segment 217 by determining if the selected cell's instance name is stored in the SEEN data structure 111. If the child cell has not been scanned, then getFlatHV module 159 will mark the cell as visited in the SEEN 111 data structure at processing segment 219. In processing segment 221, the local child cell flat data net and marker entries will be added to the % FlatHV data structure 107. Next, the local child cell flat data net, marker and component entries will be added to the % FlatHVcache 109 data structure at processing segment 223. The % FlatHVcache 109 data structure holds instance data structures which are retrieved at subsequent processing segments for addition to upper level hierarchy flat data stored during a netlist traversal sequence leading up to the currently selected cell instance. At processing segment 225, the getFlatHV module 159 calls itself recursively thereby returning to processing segment 207 with the currently designated child cell as a top cell or traversal starting point.

Processing segments 209 through 213 will be repeated parsing through non-cell elements until another child instance cell is encountered, assuming additional instances are within the currently selected cell. At processing sequence 215, the getFlatHV module 159 will again perform mapping for child cell from the child's parent to the child. Next, theGetFlatHV module 159 will determine if it has previously encountered the selected cell instance by reference to the SEEN data structure 111. If getFlatHV 159 finds the instance identifier which matches the currently selected cell in the SEEN 111 data structure, then getFlatHV 159 will retrieve the matching instance's flat data segment from % FlatHVcache data structure 109 and append the matching flat data segment to the sequence of higher level flat data corresponding to the hierarchical netlist path currently being traversed stored in the % FlatHV data structure 107. Next, at processing segment 233 the getFlatHV module 159 will copy child and parent cell relationship data back into the % FlatHVcache 109 data structure and return to processing segment 207 to continue processing.

When the getFlatHV module 159 determines at processing segment 209 that there are no additional instances along the hierarchical traversal path being processed, then getFlatHV 159 will either terminate completely at processing segment 235 or the current getFlatHV 159 module will terminate and return to the getFlatHV module 159 that previously called it at processing segment 227. Again, child cell data will be copied back to parent cell data elements within the % FlatHVcache data structure 109 to facilitate further processing and tracking of the current point of the netlist traversal. Referring to FIG. 5a, in such a manner, the progressively called getFlatHV 159 modules which executed a copy of itself at processing segment 225 will begin to complete processing and reverse the netlist traversal to the cell instance which is above the current cell which is being mapped. The processing sequence of 207 to 213 will be re-executed until another child cell instance is encountered. The processing sequence from 214 to 233 will be re-executed when a traversal selects a cell instance which matches an instance identifier in the SEEN 111 data structure, at which point the getFlatHV module 159 will retrieve the matching flat data and append the flat data to the higher level flat data corresponding to the currently netlist traversal sequence path. The higher level flat data is thus hierarchically and traversally interconnected with the appended data through the traversal sequence. In this manner, instance by instance parsing, mapping and storing is avoided saving considerable time. Referring to FIGS. 5aand 5b, complete mapping will still have to be accomplished for cells which have not yet been encountered during traversal of the netlist in processing segments 217 through 225. Processing is complete when all recursively called modules have terminated and there are no further instances at processing segment 235.

Figures 6, 6A:
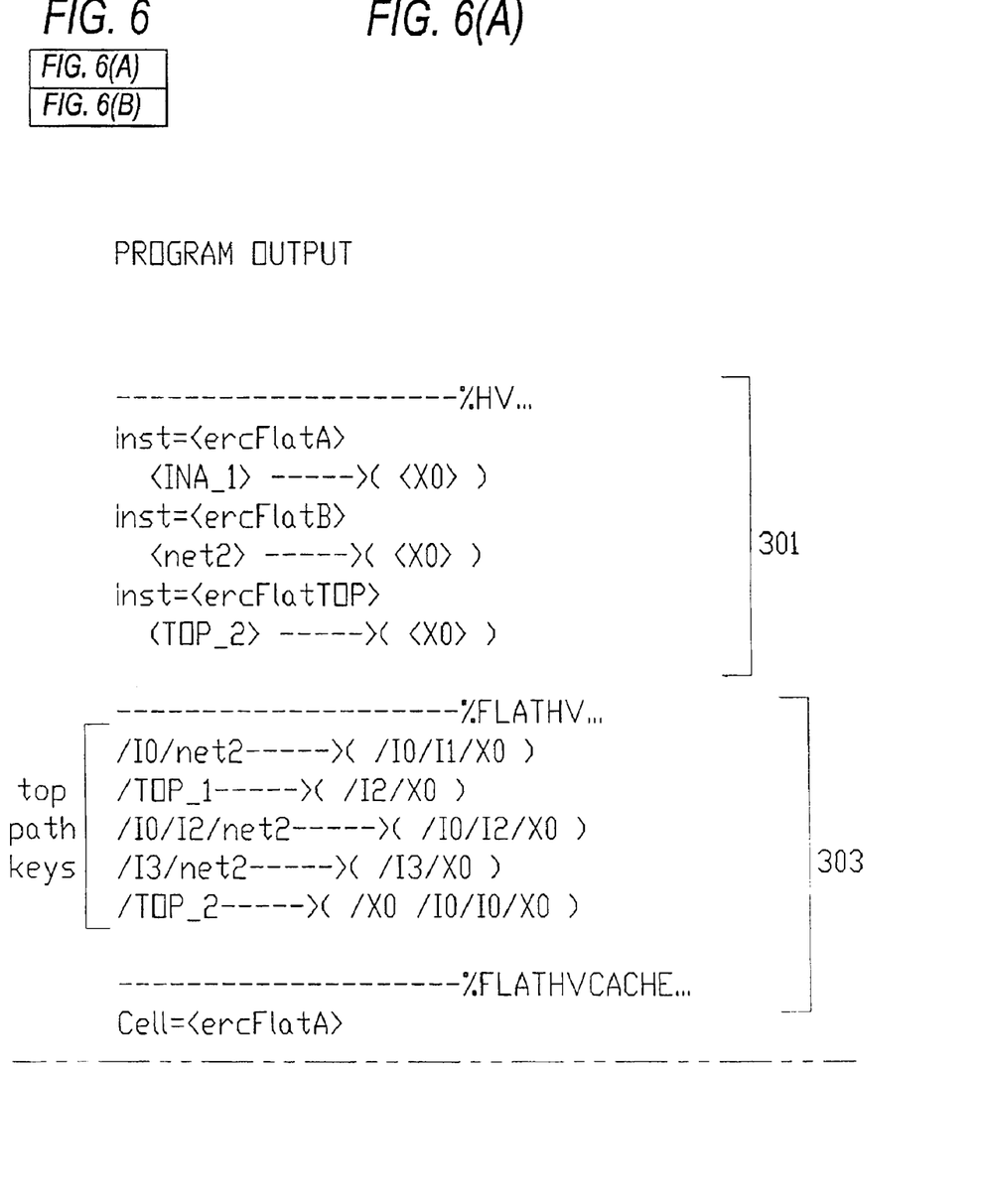
FIG. 6a shows a portion of an output from one embodiment of the invention.
Figure 6B:
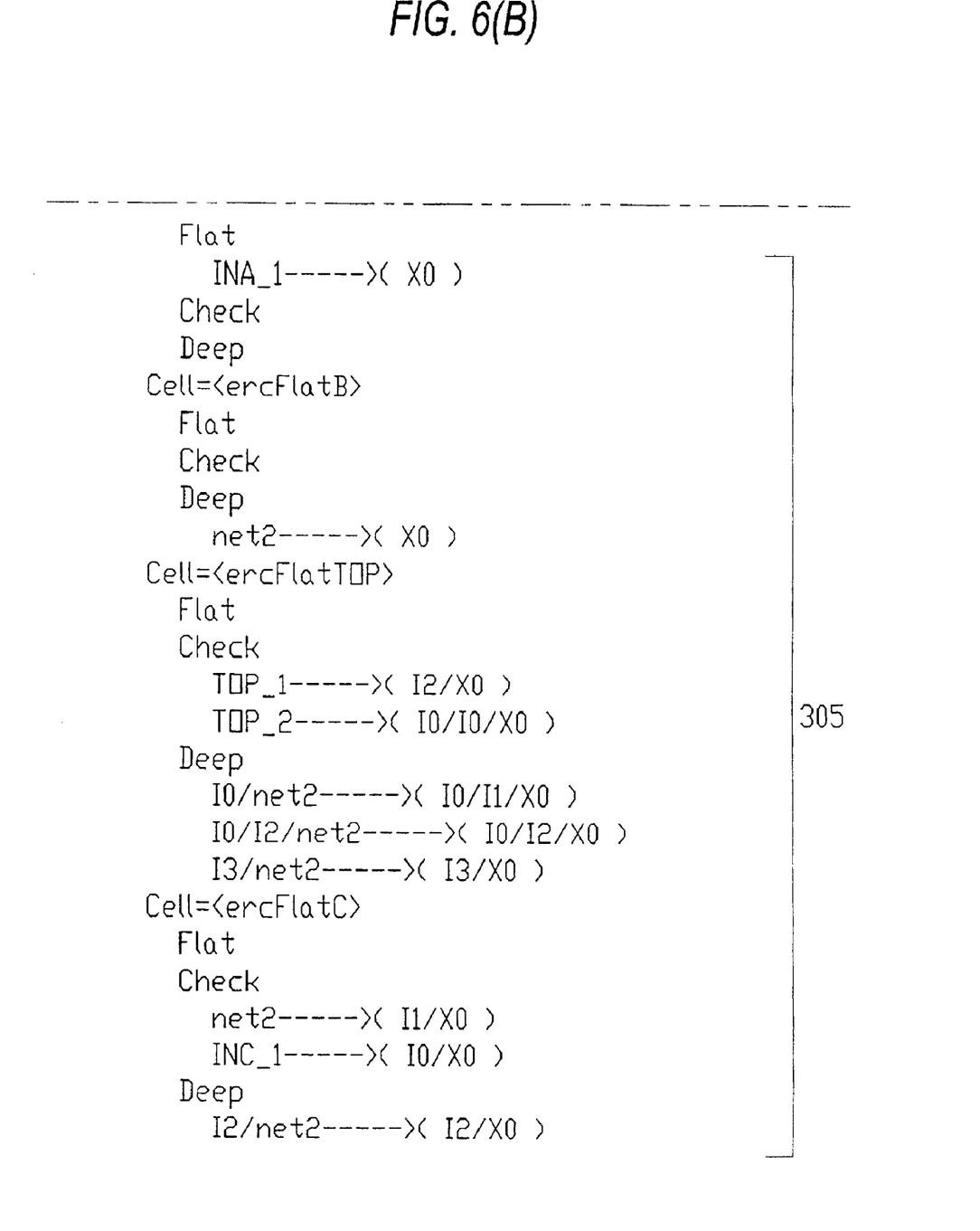
FIG. 6b shows a portion of an output from one embodiment of the invention.

Referring to FIG. 6a, output for an exemplary embodiment of the invention is shown. The first set of entries 301 under the % HV header correspond to step 203 data. The second set of entries 303 under the % FLATHV header correspond to the final flat data which is being created in the % FlatHV data structure 107 as flat data segments (and their corresponding highest level absolute net paths) are assembled during traversal. Referring to FIG. 6b, the third set of entries 305 under the % FLATHVCACHE header correspond to the data being accumulated in the % FlatHVcachc data structure 109.

Figure 7:
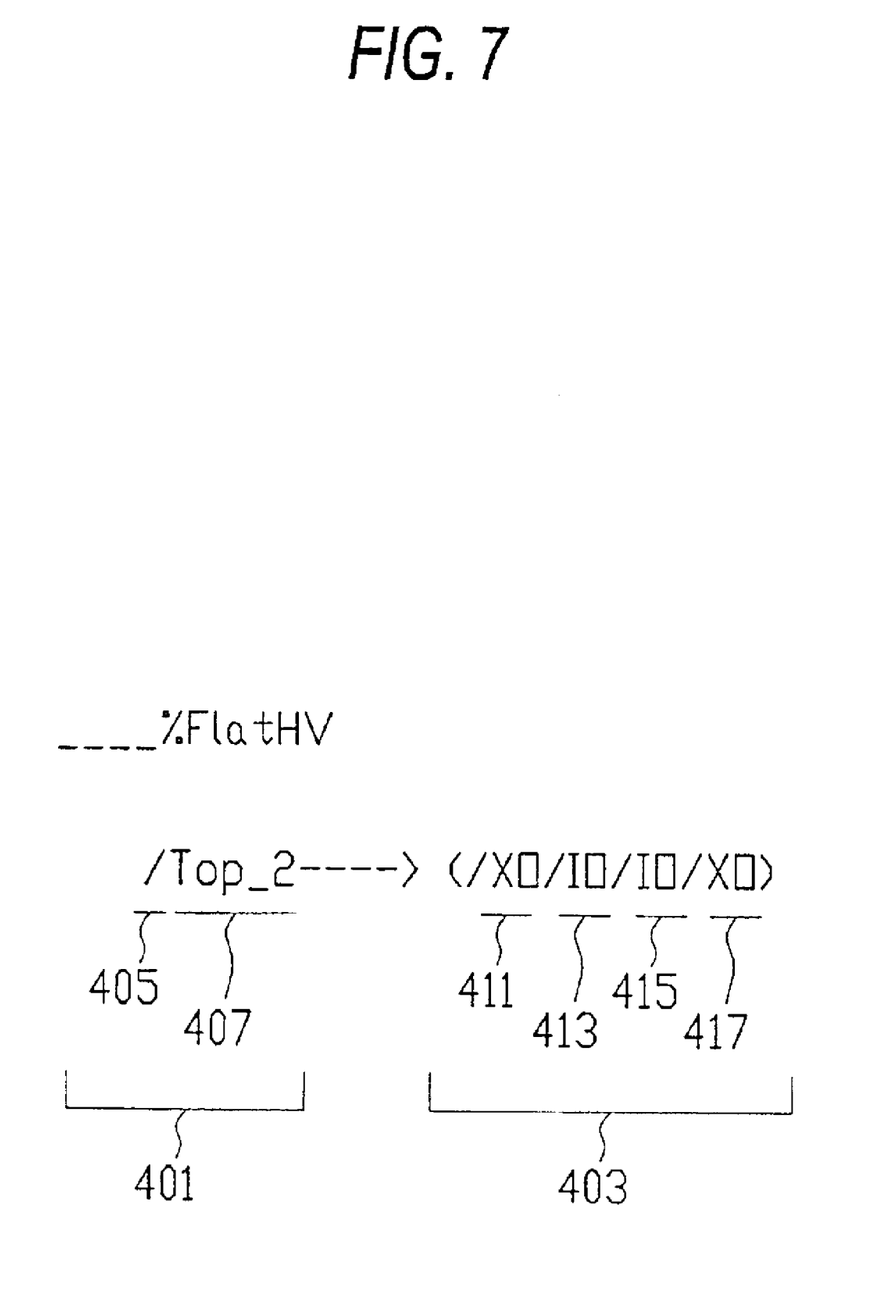
FIG. 7 shows additional detail of the FIG. 6a output in accordance with an exemplary embodiment of the invention.

Referring to FIG. 7 and also to the hierarchical representation in FIG. 1, flat data output under the % FLATHV header 303 is explained. The first set of entries 401 indicate the top path keys on the left which defines the upper hierarchical point of the flat data path sequence. The entries on the right of the dashes 403 indicate the flat data following the top net identifier on the left to a particular flat path search target point at the end of the traversal path, a HV marker in this case 417. Referring to FIG. 7, the first element "/" 405 indicates the top cell which is being scanned, in this case ercFlatTop 10 2. Top_2 407 refers to the top net starting point which is being mapped. The "/X0" entry 411 refers to the first search marker, a HV marker in this case, which was encountered while traversing along the top_2 net (FIGS. 1, 5). Next, the "/I0" entry 413 refers to the ercFlatC I0 cell in FIG. 1 (FIGS. 1, 31). Next, the "/I0" entry 415 refers to instance zero of ercflatA (FIGS. 1, 35) along the traversed net. Next, the "/X0" entry 417 refers to the final search target along the traversed net, in this case a HV marker within ercFlatA (FIGS. 1, 35). In this manner, flat data is described from any number of top nets to a search target element.

It is also possible to include any number of element descriptors in the flat data path if it is so desired. Alternative embodiments can also change the starting point for the flat data segment mapping to an element or cell other than a top net. Other nets can be specified as a starting point. Terminal points as well as intervening flat data which is stored or ignored can also be varied as well.

An embodiment of the system can also mask flat data, search targets or circuit attributes which generate invalid or undesirable error listings. In this embodiment, a hierarchical netlist 1 is loaded into the processing system 71 and the flat data is extracted as described in FIG. 5 and is stored in the % FlatHV data structure 107. The % FlatHV data structure 107 is input into an electrical rule check (ERC) program module and then error checks are run on the % FlatHV data 107. Error output data from the ERC system is stored into an % ERCerror data structure which includes an error identifier, a flat path data which corresponds to the source of the error, a cell path associated with the error and a text description of the error. Error listings are then output from the ERC program and then examined by a user.

If a user determines that the ERC program is generating invalid or undesirable circuit design error listings, the user will then identify the flat path data, error, marker or circuit attribute which is triggering the errors. The user will then input or modify the flat path data, error, marker or circuit data into the processing system 71 as mask input data into a % maskData data structure through the input device 75. The mask input data will then be used by a mask processor module to identify the flat path data which triggers the ERC program to generate the undesirable or invalid ERC error listings. The mask processor module can identify the flat path data associated with a circuit design error as every error output by the ERC system has a unique instance flat path data associated with the circuit design fault or error. In other words, each circuit design error list item is unique because of the unique flat path data which was extracted by the flat data path engine 151 and stored in % FlatHV data structure 107. The mask module will then match the flat path data in the % FlatHV data structure 107 with the mask data, then filter or extract the error listing stored in the % ERCerror data structure as it is output to screen system 79, printer 81 or to a storage medium thereby ensuring the ERC system is producing valid circuit design fault or error listings.

An embodiment of the invention can also include a flat path data mask sub-module which is incorporated into the getFlatHV module 159. Invalid or undesirable error listings are identified as discussed above, then a user can input mask data into a % maskData data structure. The getFlatHV module 159 can screen or mask specified flat path data segments as well as markers, circuit attributes or circuit components in the hierarchical netlist data input 1 as it is traversing the netlist and when netlist traversal is completed. The getFlatHV module 159 can compare the data in the % maskData data structure to a flat path data segment which is to be stored in either the % FlatHVCache 109 or the % FlatHV data structure 107, then either discard the flat data segment or proceed to store or append the data segment into the % FlatHV data structure 107. At the end of processing as described in FIG. 5, the getFlatHV module 159 can compare all the flat data stored in the % FlatHV data structure 107 with the data stored in the % maskData data structure and then delete entries which match the mask criteria stored in % maskData data structure. The filtered flat data in % FlatHV data structure 107 is then input into the ERC system which produces a revised circuit design error or fault listing.

Alternative embodiments of the invention can include the capability to search for any type of markers besides HV markers which are contained in the netlist such as super voltage (SV) net markers, pad markers, super voltage fuse markers, negative voltage net markers for lower voltage charge pumps (lower than zero volts) and any other type of marker, property, attribute assigned to a net, element, cell or instance. Any circuit element can be used as the search target or terminal point of the accumulated flat data generated by the flat data extraction program. Absolute path statement can be created to each search target by use of the search, recording of partial path statements for a cell or primitive contents data (with respect to search target) and the assembly, appending or prepending features of the invention with different specified start and endpoints. A number of steps can be accomplished in different sequences such as searching of each cell type for marker content and recording the cell type name (first hash table key) and search target contents in the form of an array in the FIG. 4 embodiment. The hash table keys can also be arranged differently or a different form of organization or program may also be used to implement the invention such as Perl, Lisp, C, C++, C# or any other programming language capable of performing functions of the present invention such as storing the required data, organizing the cell and marker data, performing searches, assembly of segments, appending or prepending path fragments.

What is claimed is:

1. A computer implemented system for extracting flat data from a hierarchical representation of a circuit comprising:
    a processing sequence that selects an element during a traversal of a hierarchical representation of a circuit;
    a processing sequence that determines if flat data for the element has been previously stored; and
    a processing sequence which, if flat data has been previously stored, appends previously stored flat data to an accumulated flat data that is hierarchically and traversally related to the selected element.

2. A computer implemented system of claim 1 wherein execution of processing sequences for selection of an element, determination of previous storage of the element and appending of stored flat data is performed recursively.

3. A computer implemented system of claim 1 further comprising a processing sequence for masking a specified flat data stored in the accumulated flat data.

4. A computer implemented system of claim 1 wherein the selected element's previously stored flat data describes a circuit attribute.

5. A computer implemented system of claim 4 wherein the circuit attribute comprises a high voltage net marker.

6. A computer implemented system of claim 4 wherein the circuit attribute comprises a super high voltage net marker.

7. A computer implemented system of claim 4 wherein the circuit attribute comprises a conductor pad marker.

8. A computer implemented system of claim 4 wherein the circuit attribute comprises a fuse marker.

9. A computer implemented system of claim 4 wherein the circuit attribute comprises a negative voltage net marker.

10. A computer implemented system of claim 4 wherein recursive selection of an element in a hierarchical traversal path terminates when no lower level hierarchical elements are found in the hierarchical path which is being traversed.

11. A computer implemented system of claim 10 wherein the last marker found in the current hierarchical path traversal will be the last flat data descriptor in the accumulated flat data which was assembled during the traversal which was terminated.

12. A computer implemented system for extracting flat data from a hierarchical representation of a circuit comprising:
- a first data structure for storing a flat data segment when an instance of a cell is initially encountered during traversal of a hierarchical representation;
- a processing sequence for selecting a cell instance from the hierarchical representation during traversal of the representation;
- a processing sequence for determining if a selected cell instance has a matching flat path data segment stored within the first data structure; and
- a processing sequence for retrieving the flat path data segment for the matching cell instance from the first data structure.

13. A computer implemented system for extracting flat data from a hierarchical representation of a circuit of claim 12 further comprising:
- a second data structure for storing one or more sequences comprising flat data segments which describe one or more sequence of instances from a higher level instance in the hierarchical representation to a lower level instance or element within a lower level instance;
- a processing sequence for assembling the retrieved flat path data segment from the first flat data structure with accumulated flat data, said accumulated flat data comprised of flat data in the second data structure which is hierarchically and traversally related to the selected instance thereby revising said accumulated flat data.

14. A computer implemented system of claim 13 further comprising
- a third data structure for storing data for indicating flat data which will not be stored in the second data structure;
- a processing sequence that aborts flat data storage in the second data structure when said sequence compares the flat data segments to be stored in the second data structure with flat data stored in the third data structure and finds a match between the compared flat data.

15. A system of claim 14 wherein operations within one or more of said processing sequences are performed recursively.

16. A system of claim 14 wherein assembled flat data is bounded on one point by a top net and at a terminal point by a specified element.

17. A system for generating flat data from a hierarchical representation of a circuit comprising:
- a first data structure for storing a hierarchical representation of a circuit comprising instances and elements within instances;
- a second data structure for storing instance flat data segments describing elements within a instance when an instance is initially encountered during traversal of said hierarchical representation;
- a third data structure for storing accumulated flat data segments which describe sequences of hierarchically and traversally related elements within instances present in said hierarchical representation;
- a fourth data structure for storing identifiers of an instance having a flat data segment stored in the second data structure;
- a first processing sequence for selecting instances and elements of the hierarchical representation stored in the first data structure;
- a second processing sequence for determining if the selected instance's flat data segment has already been stored within the second data structure by reference to the fourth data structure list of instance identifiers;
- a third processing sequence for identifying and storing flat data describing the selected instance that is not listed by identifier within the fourth data structure, said third processing sequence storing the selected instance's flat data within the second data structure as well as in the third data structure, said third processing sequence adding the selected instance's flat data to sequences of hierarchically and traversally related flat data elements stored in the third data structure;
- a fourth processing sequence for retrieving the flat path data segment for a selected instance which is listed in the fourth data structure from the second data structure; and
- a fifth processing sequence for storing the retrieved flat path data segment and the selected instance's flat path data thereby storing revised flat path data in the third data structure.

18. A system of claim 17 wherein instances are comprised of cells.

19. A system of claim 17 wherein the elements are comprised of nets.

20. A system of claim 17 wherein the elements comprises a marker indicating a circuit attribute.

21. A system of claim 20 wherein the circuit attribute represents a high voltage net.

22. A system of claim 20 wherein the circuit attribute represents a super high voltage net.

23. A system of claim 20 wherein the circuit attribute represents a conductor pad.

24. A system of claim 20 wherein the circuit attribute represents a fuse.

25. A system of claim 20 wherein the circuit attribute represents a negative voltage net.

26. A system for extracting flat data from a hierarchical representation of a circuit comprising:
- means for selecting elements of a hierarchical representation of a circuit and determining flat data for a selected cell element;
- means for identifying repetitive cell instance elements of the hierarchical representation of a circuit and storing cell element instance identifiers in a first data structure;
- means for storing the determined flat data for a selected cell element in a second data structure for storing element flat data segments for each cell element and in a third data structure for storing accumulated flat data segments which describe sequences of hierarchically related elements;
- means for identifying a selected cell element with an instance identifier which matches an identifier stored in the first data structure; and means for retrieving the flat data segment for the selected element with a matching identifier in the second data structure and appending the retrieved flat data segment with a higher level hierarchically related flat data sequence stored within the third data structure.

27. A system of claim 26 further comprising a means for masking specified flat data being input into the second data structure.

28. A storage medium containing program code for operating a computer to extract flat data from a hierarchical representation of a circuit by the operations comprising:
   selecting an element during a traversal of a hierarchical representation of a circuit;
   determining if flat data for the element has been previously stored; and
   if flat data has been previously stored, then appending previously stored flat data to an accumulated flat data that is traversally related to the selected element.

29. A method for generating flat data from a hierarchical representation of a circuit comprising:
   selecting an element during a traversal of a hierarchical representation of a circuit;
   determining if flat data for the element has been previously stored; and
   if flat data has been previously stored, then appending previously stored flat data to an accumulated flat data that is traversally related to the selected element.

30. A method of claim 29 further comprising
   specifying flat data which is to be masked from input into the accumulated flat data and storing said flat data which is to be masked into a mask data structure;
   determining if flat data for said element selected during a traversal matches flat data in the mask data structure;
   if a match is found between the mask data structure flat data and flat data for said element during traversal, aborting the appending of previously stored flat data to an accumulated flat data that is traversally related to the selected element.

31. A method for generating flat data from a hierarchical representation of a circuit comprising:
   storing a hierarchical representation of a elements of a circuit into a data structure;
   selecting an element from the stored hierarchical representation;
   determining if the element is a cell;
   if the element is a cell, storing flat path data for elements within the cell in a first flat path data structure which stores flat path segments for the cell and second flat path data structure which stores combined flat path segments;
   selecting a second element from the hierarchical representation which has not been selected;
   determining if the selected second element has flat data that matches flat data for an element in the first flat path data structure;
   if a cell with matching flat data is found in the first flat path data structure, retrieving the flat path data segment for the cell with matching flat data from the first flat path data structure; and
   storing the retrieved flat path data segment and the first flat path data structure hierarchically interconnected to the selected second element thereby storing a combined flat path data in the second flat path data structure.

32. A method for extracting and storing reusable flat data from a hierarchical netlist comprising:
   selecting a cell instance which has not been encountered during netlist traversal;
   determining a flat path data describing elements along a net within the selected cell from the cell instance upper level hierarchy boundary point which is being traversed to a lower hierarchy boundary point comprised of either another cell boundary point within the selected cell or a last lower hierarchical element instance within the selected cell; and
   storing the flat path data segment for the selected cell instance in a first data structure;
   retrieving a stored sequence of flat data segments which describe flat data for higher level instances in the traversal sequence;
   assembling the flat data segment with the retrieved sequence of flat data segments; and
   storing the assembled segments in a second data structure.

33. A method of generating flat data from a hierarchical representation of a circuit comprising:
   selecting a first element within the hierarchical representation which has not been processed;
   if the selected first element is a cell, storing an identifier for the first element into a first data structure;
   storing flat data describing flat path data comprised of element instance identifiers for elements within the first element to a second data structure; and
   storing flat data describing flat path data comprised of element instance identifiers within the first element within a third data structure for storing one or more accumulated sequences of flat data segments, said each of said sequences describes flat data for elements along a traversal path of a net within the hierarchical representation.

34. A method of claim 33 further comprising:
   selecting second element within the representation; and
   determining if the selected element has an identical identifier as an element listed in the first data structure.

35. A method of claim 34 further comprising:
   if the first data structure contains an element identifier which matches the selected second element's identifier, retrieving the flat data segment for the matched element from the second data structure;
   combining the flat data in the second data structure which is at a higher level in the representation and interconnected with the higher level segments in the third data structure with the retrieved flat data segment thereby creating a combined flat data segment; and
   replacing the flat data segment in the second data structure.

36. A method of claim 35 wherein said sequence of flat data segments describe one or more elements comprised of instance identifiers for nets, cells, markers and other circuit components on a net within the hierarchical representation which lie along a traversal path of the net.

37. A method of extracting flat data from a hierarchical representation of a circuit comprising:
   selecting a first element of a hierarchical representation of a circuit;
   determining if the first element has the same flat data as a previously selected element, wherein said previously selected element's flat path data segment has been previously determined and stored in a first data structure;

if the first element is identical to the previously selected element, retrieving the flat path data for the previously selected element from the first data structure;

combining a copy of the retrieved flat path data segment with a cumulatively combined flat data containing a sequence of flat path data segments stored in a second data structure, wherein said combined flat data describes hierarchical elements along a hierarchical representation traversal path; and storing said cumulatively combined flat data in the second data structure.

* * * * *

UNITED STATES PATENT AND TRADEMARK OFFICE
CERTIFICATE OF CORRECTION

PATENT NO. : 6,886,140 B2 Page 1 of 1
DATED : April 26, 2005
INVENTOR(S) : John W. Regnier It is certified that error appears in the above-identified patent and that said Letters Patent is hereby corrected as shown below:

Column 1,
Line 42, "permits" should read -- permit --;

Column 3,
Line 28, "assembles" should read -- assemble --;

Column 4,
Lines 4 and 8, "embodiment the" should read -- embodiment of the --;

Column 10,
Lines 49-50, "to an accumulated" should read -- to accumulated --;

Column 11,
Line 35, "sequence" should read -- sequences --;

Column 12,
Line 39, "comprises" should read -- comprise --;

Column 13,
Lines 28 and 38-39, "to an accumulated" should read -- to accumulated --; and
Line 43, "of a elements" should read -- of elements --.

Signed and Sealed this

Thirteenth Day of December, 2005

JON W. DUDAS
*Director of the United States Patent and Trademark Office*